(12) United States Patent
Stoeckli et al.

(10) Patent No.: US 11,866,826 B2
(45) Date of Patent: Jan. 9, 2024

(54) PLASMA COATING LANCE FOR INTERNAL COATINGS

(71) Applicant: OERLIKON METCO AG, WOHLEN, Wohlen (CH)

(72) Inventors: Martin Stoeckli, Boswil (CH); Alexander Paul Michla, Wohlen (CH)

(73) Assignee: OERLIKON METCO AG, WOHLEN, Wohlen (CH)

( * ) Notice: Subject to any disclaimer, the term of this patent is extended or adjusted under 35 U.S.C. 154(b) by 159 days.

(21) Appl. No.: 16/617,036

(22) PCT Filed: May 29, 2018

(86) PCT No.: PCT/EP2018/000276
§ 371 (c)(1),
(2) Date: Nov. 26, 2019

(87) PCT Pub. No.: WO2018/219497
PCT Pub. Date: Dec. 6, 2018

(65) Prior Publication Data
US 2020/0255942 A1 Aug. 13, 2020

(30) Foreign Application Priority Data
May 29, 2017 (EP) .................................... 17000902

(51) Int. Cl.
*C23C 16/455* (2006.01)
*B33Y 80/00* (2015.01)
(Continued)

(52) U.S. Cl.
CPC ........ *C23C 16/45563* (2013.01); *B33Y 80/00* (2014.12); *C23C 16/045* (2013.01); *C23C 16/513* (2013.01)

(58) Field of Classification Search
CPC ............ C23C 16/45563; C23C 16/513; C23C 16/453; C23C 16/045; C23C 4/134; B05B 13/0636
See application file for complete search history.

(56) References Cited

U.S. PATENT DOCUMENTS 4,912,296 A * 3/1990 Schlienger ............... H05H 1/34
219/121.52
4,970,364 A 11/1990 Mueller
(Continued)

FOREIGN PATENT DOCUMENTS

DE          36 45 235        3/1992
DE     10 2013 007 737       11/2014
(Continued)

OTHER PUBLICATIONS

Int'l Search Report (Form PCT/ISA/210) conducted in Int'l Appln. No. PCT/ EP2018/000276 (dated Oct. 8, 2018).
(Continued)

*Primary Examiner* — Joseph A Miller, Jr.
(74) *Attorney, Agent, or Firm* — GREENBLUM & BERNSTEIN, P.L.C.

(57) ABSTRACT

The invention relates to a coating lance for a plasma process, the lance comprising a plasma shaft, a plasma neck, and a plasma head, the plasma shaft comprising a longitudinal channel, which extends in an axial direction along an axis from a first shaft end to a second shaft end, the plasma neck comprising a shaft boss and a head boss and at least one neck channel, which extends from the shaft boss to the head boss, and the shaft boss being arranged on the second shaft end in such a way that the longitudinal channel leads into the at least one neck channel, the plasma head comprising a neck boss, a plasma opening, and at least one head channel, which extends from the neck boss to the plasma opening, and the neck boss of the plasma head being arranged on the head (Continued)

boss of the plasma neck in such a way that the at least one neck channel leads into the head channel. The course of the plasma channel deviates from the axis in such a way that the neck channel leads into the head channel eccentrically with respect to the axis, i.e. at an offset to the axis.

15 Claims, 10 Drawing Sheets

(51) Int. Cl.
*C23C 16/04* (2006.01)
*C23C 16/513* (2006.01)

(56) References Cited

U.S. PATENT DOCUMENTS

| | | | |
|---|---|---|---|
| 5,271,967 A * | 12/1993 | Kramer | C23C 4/12 427/236 |
| 5,328,516 A | 7/1994 | Dietiker | |
| 5,452,854 A * | 9/1995 | Keller | B05B 13/0636 239/80 |
| 2005/0186355 A1 * | 8/2005 | Miyamoto | C23C 4/131 427/446 |
| 2008/0185366 A1 | 8/2008 | Suslov | |

FOREIGN PATENT DOCUMENTS

| | | |
|---|---|---|
| DE | 10 2014 010 665 | 1/2016 |
| EA | 7057 | 6/2006 |
| RU | 2075535 | 3/1997 |
| RU | 2181390 | 4/2002 |
| RU | 2278904 | 6/2006 |
| WO | 2018/219497 | 12/2018 |

OTHER PUBLICATIONS

Int'l Written Opinion (Form PCT/ISA/237) conducted in Int'l Appln. No. PCT/ EP2018/000276 (dated Oct. 8, 2018).
Russia Search Report conducted in counterpart Russia Appln. No. 2019143076/05 (dated Sep. 29, 2021).
Russia Office Action conducted in counterpart Russia Appln. No. 2019143076/05 (dated Feb. 16, 2022) (w/ translation).

* cited by examiner

PLASMA COATING LANCE FOR INTERNAL COATINGS

The invention relates to a coating lance for a plasma process for internal coatings of rotational, asymmetrical or free-form surfaces. Here, the curvature directions of the surface are included in concave as well as convex direction.

In the coating process, a plasma 5 is generated via an arc with the aid of a gas mixture into which plasma a powder gas mixture or a wire is injected. By the thermal energy of the plasma, the supplied material is partially melted or completely melted and deflected away from the coating lance in the direction of the surface to be coated by the kinetic energy of the plasma. In this case, an injection from all directions is possible.

The partially melted or completely melted material is accelerated onto the substrate and adheres there by clinging to the surface. The ductile material drops deform plastically and form a mechanical clinging with the previously activated surface (roughening process/undercuts). During the solidification process, the material drops release the thermal energy previously absorbed by the plasma to the substrate.

Conventional mechanical manufacturing processes

Figure 1:
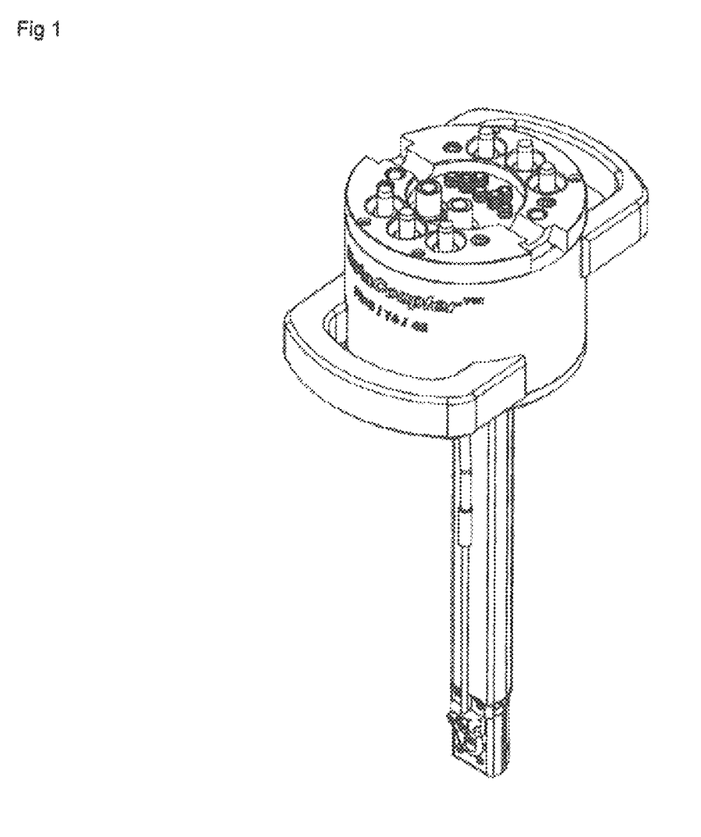
FIG. 1: coating lance

In the state of the art in torch construction, the conventional manufacturing methods, such as turning, drilling, milling, casting, and also soldering and bonding of plasma lances are known. Here, the design is very often affected by the manufacturing methods. Particularly with extended and thin internal coating tools (FIG.: 1), conventional manufacturing methods, such as drilling, reach their physical load limits. Even in the development phase, meaningful feasibility is often hampered by the manufacturing processes.

Figure 2:
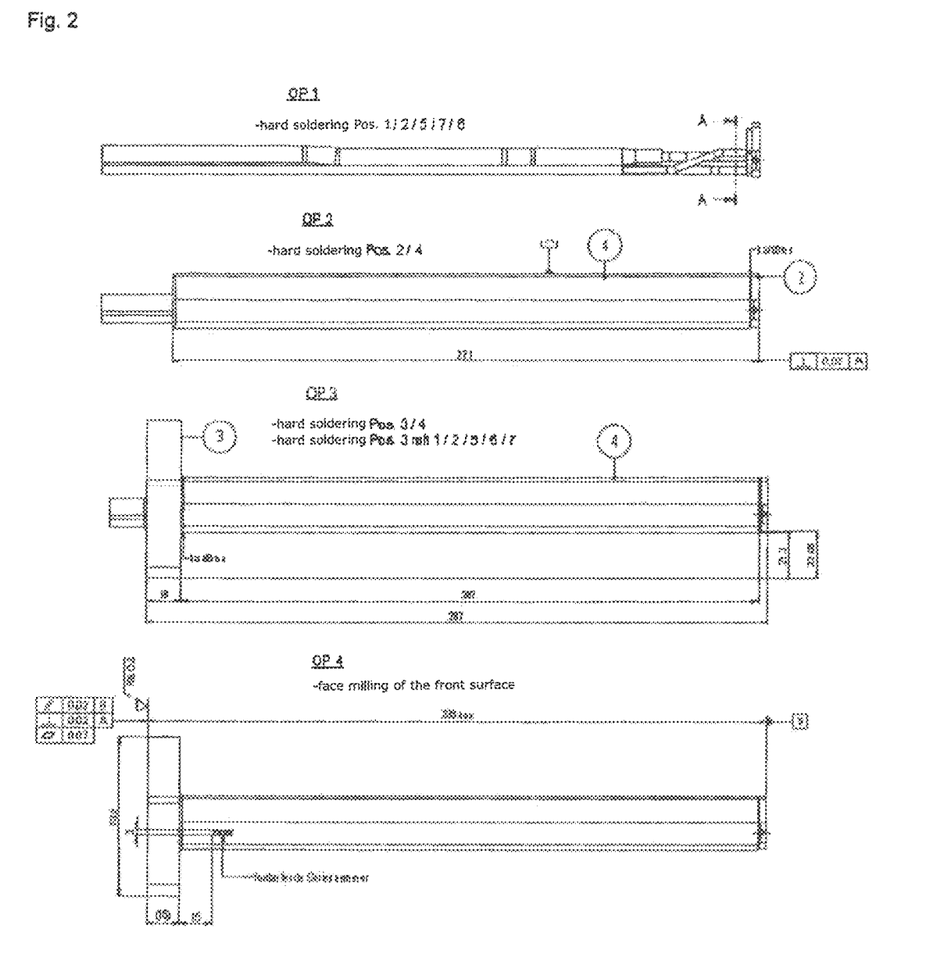
FIG. 2: manual soldering drawing
Figure 3:
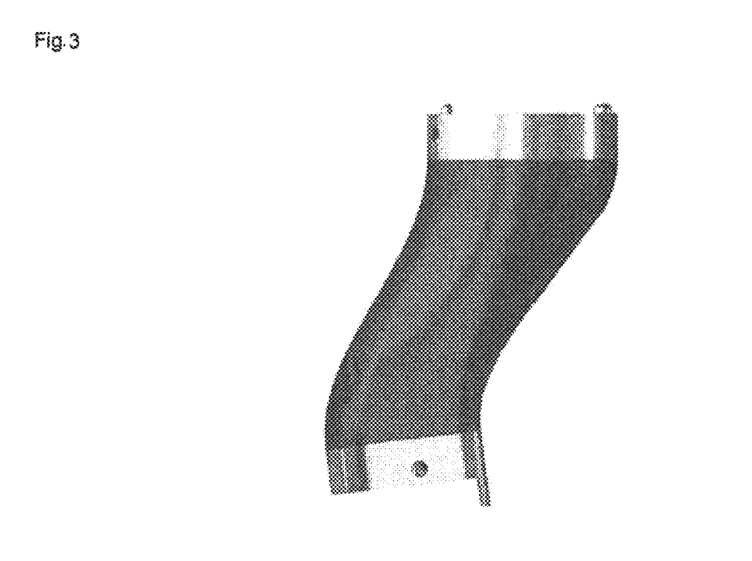
FIG. 3: additively manufactured plasma head made of a copper alloy
Figure 4:
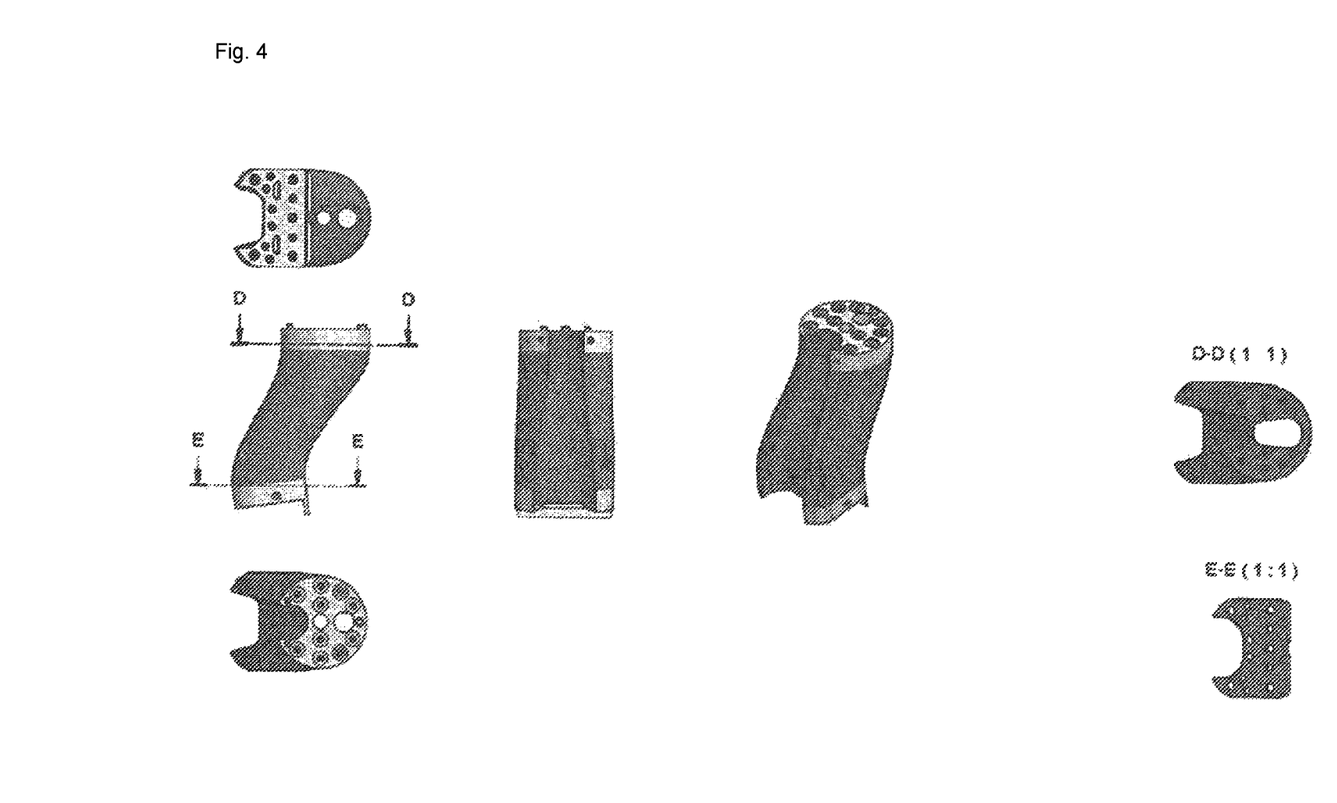
FIG. 4: additively manufactured plasma head in detail (inside curved bores)
Figure 5:
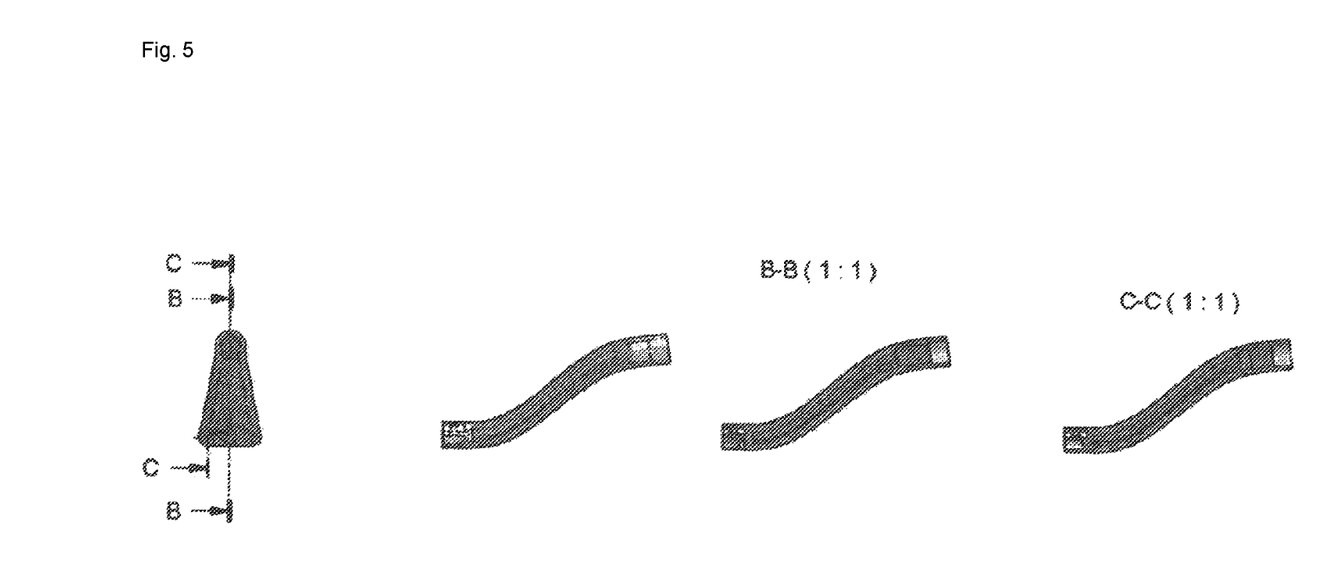
FIG. 5: additively manufactured negative pole made of copper alloy
Figure 6:
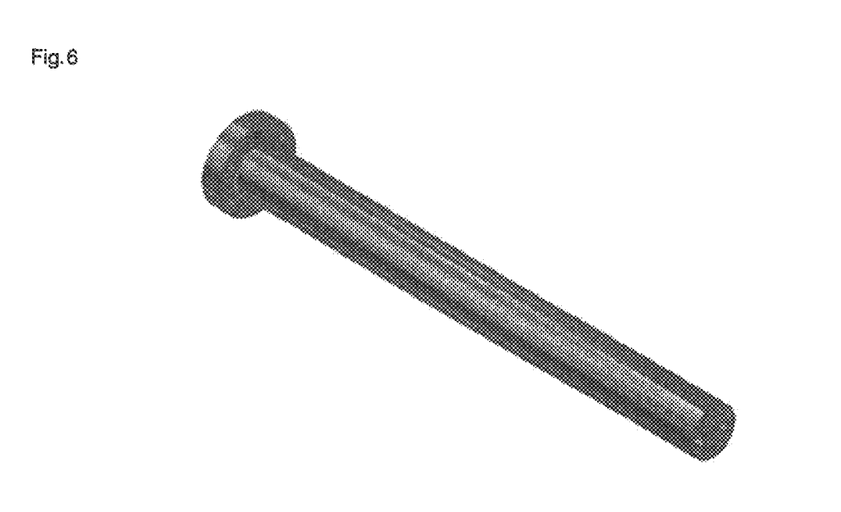
FIG. 6: deep hole drilled lance
Figure 7:
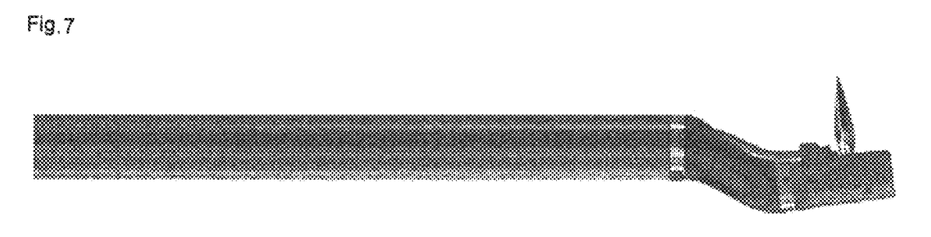
FIG. 7: connection plasma head, negative pole and lance

In the past, a long lance required with a reduced diameter could often only be realized by laborious manual work and countless processing steps. In this case, extruded pipes were bent and soldered together. The pipes had the function to separate the different media in gas, electrical and liquid form from each other, to insulate them and to transport them to the plasma head. Due to the non-detachable connection "soldering", a revision was only difficult or very complex possible. (FIG.: 2)

The figures show:

FIG. 15: F210 RotaCoupler™ Centerline Additive manufacturing process and deep hole drilling Due to the manufacturing process of additive manufacturing, new possibilities arise in the constructive design phase. Any shape can be created and manufactured. Due to this advantage, very compact components with free-form surfaces can be manufactured independently of conventional methods. (FIG.: 3). In particular drillings, which up to now had to be made in a round design or had to be eroded out with expensive production tools and were only possible in a straight design, can have any geometric design in the additive manufacturing process. A further advantage is the "drilling around the corner", which allows drillings to be made in curved paths past each other or crossing each other in different planes but not intersecting. Due to these advantages, optimized pipe routing and optimal material utilization can be ensured, whereby a miniaturization of the torch lance can be ensured. (FIG.: 4)

It would be technically possible to manufacture the entire lance by means of the additive process, but this is as yet uneconomical and currently not necessary. For this reason, only the plasma head (FIG.: 4) and the negative pole (FIG.: 5) at the plasma head are created by the additive manufacturing. In connection with the additive manufacturing, the "deep hole drilling" manufacturing process is used in order to form the shaft of the lance. This process is limited in length in connection with the bore diameter. In order to compensate for this, several deep hole drilled shafts (FIG.: 6) can be lined up and screwed together. In theory, this would not limit the length of the lance. To finish the coating lance, the additively manufactured plasma head components and the deep hole drilled lance are screwed together. (FIG.: 7)

Plasma Lance and RotaPlasma® HS1

In the past, the coating lance was manufactured by means of the manufacturing processes described above. The RotaPlasma® process is a rotative coating process. A rotary feedthrough transports the media from the stationary connection to an endlessly rotating shaft. A plasma lance is adapted to this shaft end, whereby an internal coating of, for example, cylinder running surfaces of an engine block can be coated.

Figure 8:
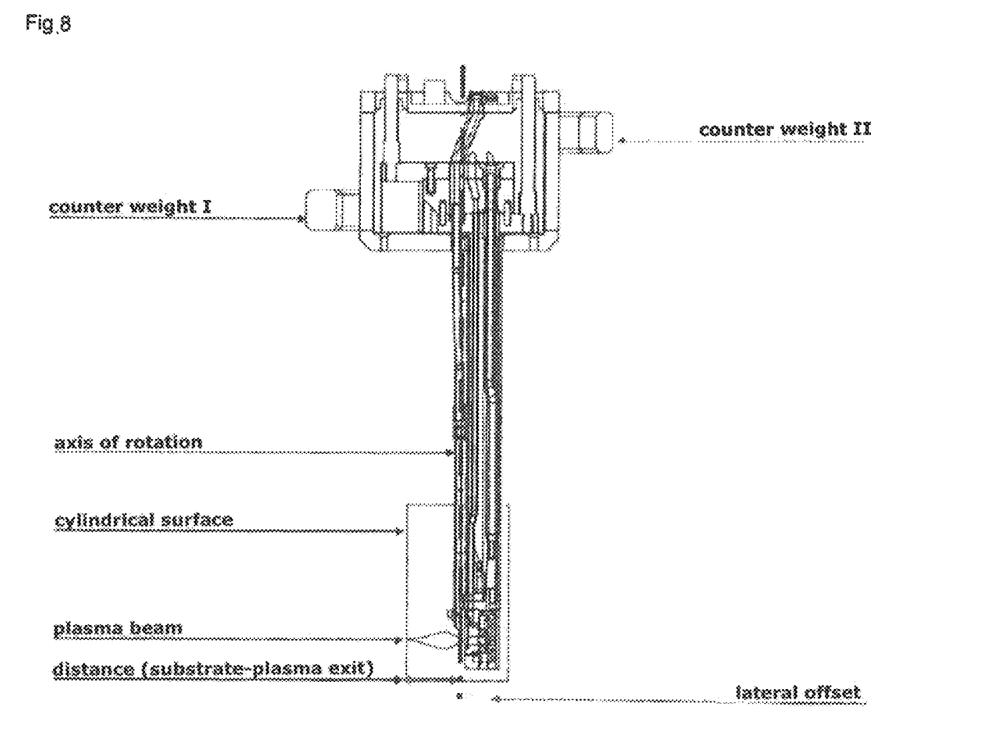
FIG. 8: lateral offset to maintain distance to the cylinder wall

When coating a substrate, a surface speed and a certain distance must be maintained. During the rotation of the lance, a feed in the drilling axis direction and the melting process described above, a layer build-up on the substrate surface is created. Here, the distance between plasma exit and the substrate surface remains constant. Since the axis of the rotating shaft of the RotaPlasma® is arranged coaxially to the axis of rotation of the drilling, the plasma head must be deflected laterally to the drilling axis when a larger drilling is to be coated. In previous designs, the entire plasma lance was deflected laterally, resulting in strong centrifugal forces at the increased rotational speed. These centrifugal forces generated unwanted vibrations and loads on the drive system as well as on the coating quality of the substrate. In order to counteract the centrifugal forces, counterweights were attached to dynamically balance the unbalance of the lateral offset. Since, as described above, the entire lance was displaced laterally, an enormous unbalance was caused. (FIG.: 8)

Figure 9:
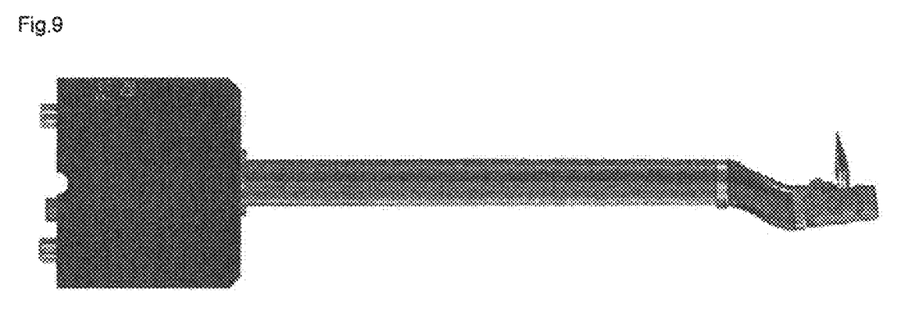
FIG. 9: lateral offset only on the torch head

Due to the previously described manufacturing methods of the new coating lance, only the plasma head is deflected laterally. The lance remains arranged coaxially to the rotating shaft of the RotaPlasma®. By using this method, only a small center of mass of the coating lance is laterally offset from the axis of rotation, which results in a significant reduction of the centrifugal force and the resulting dynamic unbalance. As a result, a reduction of the balancing weights is ensured. Thus, almost any distance between plasma exit and substrate surface is possible. (FIG.: 9) A further advantage of the new manufacturing processes is the constant mass points of all components. After a lance has been manufactured, the unbalance is measured and the counterweights are manufactured. Each further plasma lance with constant lateral offset can be balanced with the previously defined weights. In comparison to conventional manufacturing (manual work), each lance was a unique piece, and was only very difficult and inaccurate to balance automatically. This means that lance one was manufactured with lateral offset x, subsequently the unbalance was determined on a balancing machine and the counterweights were defined in order to manufacture them and attach them to the lance. If later lance two was manufactured with the same lateral offset as lance one, lance two did not have the same unbalance. As a result, an automated small series production of plasma lances became more difficult. The inaccuracy is the result of the tolerance summation of the manual work in the upstream processes. In contrast, the new manufacturing processes are many times more precise and consistent.

Filling Degree Undercut

Figure 10:
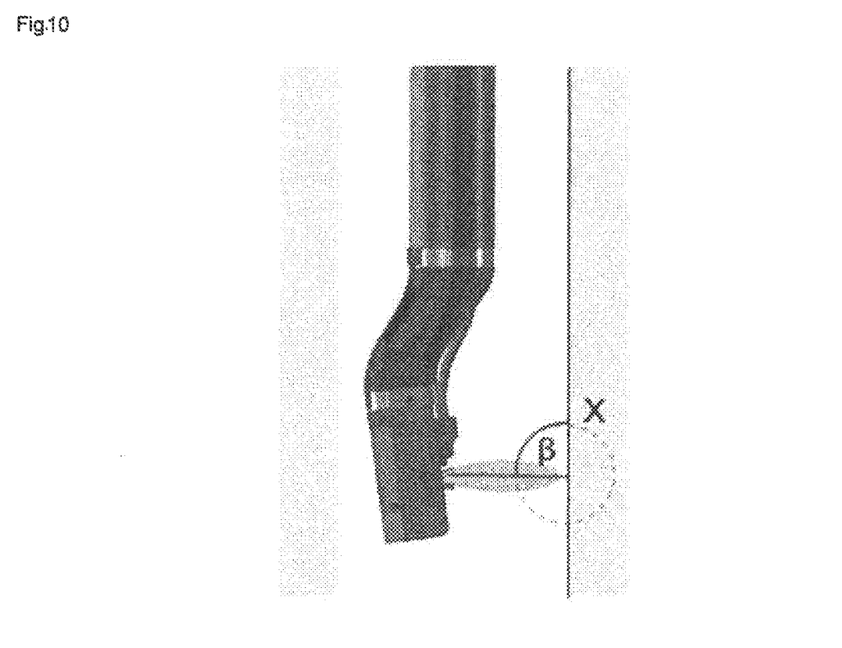
FIG. 10: coating
Figure 11:
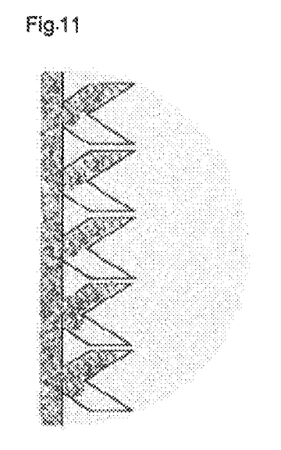
FIG. 11: insufficient profile filling due to non-rectangular impact of the particles (shadow effect)
Figure 12:
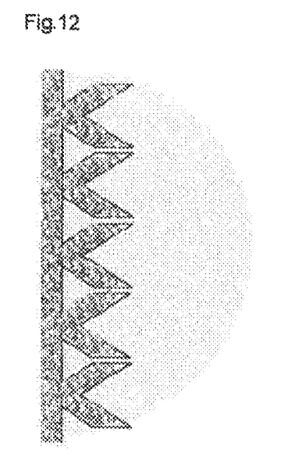
FIG. 12: sufficiently filled profile filling of the undercuts

In order to achieve adhesion between molten particles and substrate during coating (FIG.: 10), the surface of the work piece must be pretreated. Here, mechanical and thermal processes are known. A decisive factor in all processes is the generation of undercuts on the work piece surface in order to achieve a clinging between the substrate and the molten particles. Thermal processes here are laser activation. In contrast to this are the mechanical processes of activation: corundum jets, pulsating water jets and the mechanical cutting tool. Due to the corundum jet as well as the pulsating water jet activation, a chaotically disordered stochastic undercut geometry results. In contrast to this, the cutting inserts in the cutting tool produce a spiral contour by rotation and feed. The cutting geometry is similar to that of a dovetail, creating orderly undercuts. In contrast to the activation processes described above, this design requires an almost right-angled impact of the melted particles in order to prevent an incompletely filled profile filling (FIG.: 11) and to achieve a complete filling of the dovetail base (FIG.: 12). Only then, a sufficient clinging can be achieved.

Figure 13:
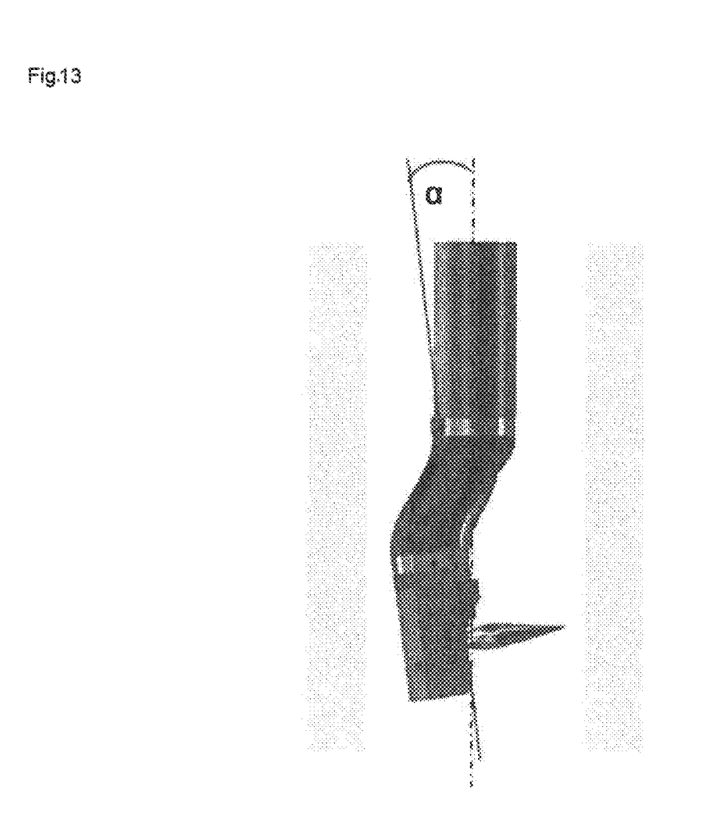
FIG. 13: angle correction

In the new manufacturing process described above, the geometries of the plasma head are freely selectable. The direction of movement of the molten particles is influenced and deflected by the plasma jet. However, in particular when injecting from above, the plasma jet is deflected downwards by the mechanical energy of the powder-gas mixture. This is particularly remarkable in the case of increased feed rates. In order to counteract this phenomenon and to correct the trajectory of the particles and the associated angle of impact to 90° to the substrate surface, the angle of the plasma exit must be corrected. (FIG.: 13)

Figure 14:
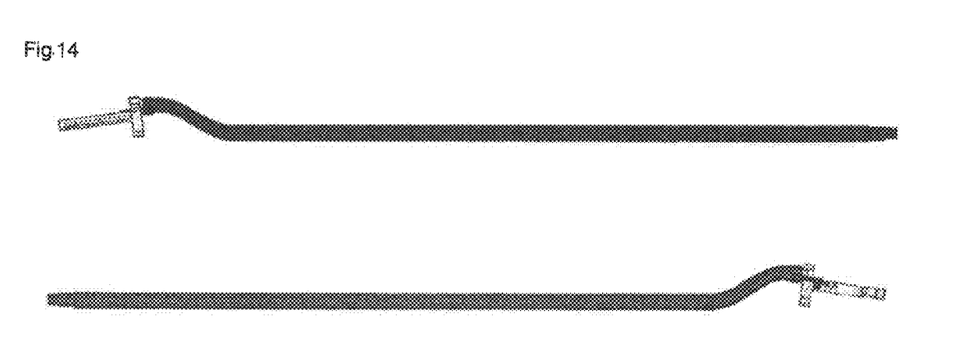
FIG. 14: gas-cooled anode (pipe profile copper alloy, negative pole additively manufactured, insulation (black), insulation anode-cathode (white))
Figure 15:
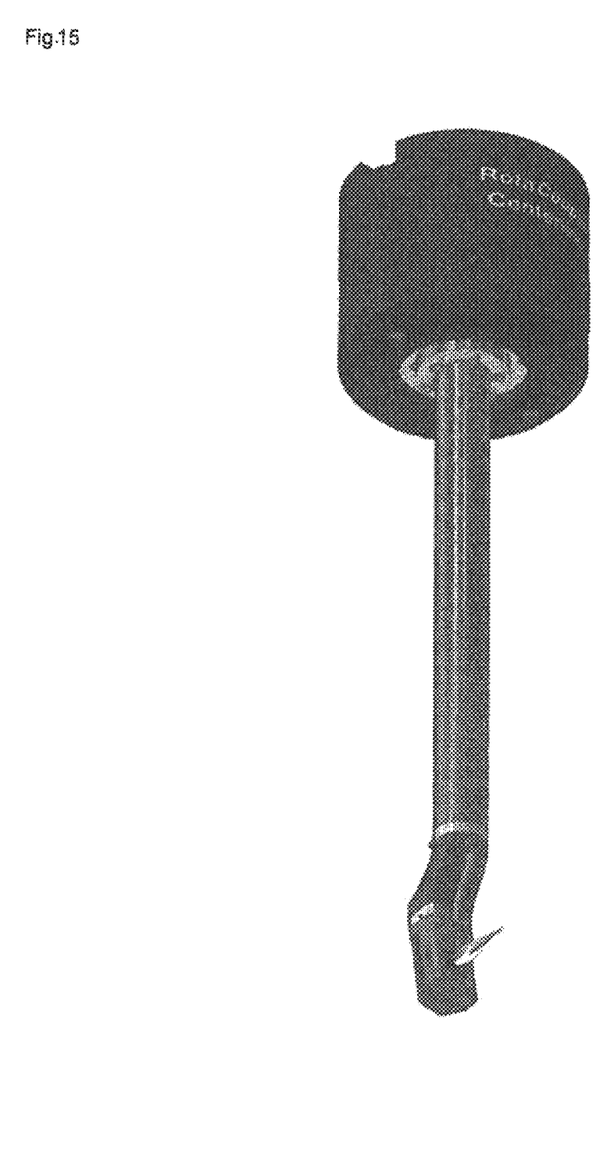

Angle Correction $\alpha=0$ lance and plasma head vertically aligned $-90°<\alpha<0°$ lance vertical, plasma head $\alpha<0°$ inclined Current load minus pole In order to generate a plasma, it is necessary to generate an arc in addition to a gas mixture. For this purpose, the cathode and anode are led electrically insulated from each other to the plasma head. Due to an ignition spark in the kV range, an arc jumps from the cathode to the anode. In doing so, the gas mixture and the arc are transferred into a plasma. As a result, the voltage reduces abruptly and, analogously, the current rises. As a result of the introduction of the current in the 300-600 A range and the resulting contact resistance, an enormous thermal current load is created on the cathode and anode. In previous designs of the plasma lances for internal coatings, the current and thus the plasma power were limited. Here, the surface load of the small plasma lance, in particular of the cathode, represented a considerable weak point. This phenomenon was less critical for the anode, as it could be designed water-cooled. To reduce the current load on the cathode rail, the cathode (negative pole) is actively cooled. This is done by the gas mixture, which is necessary for the plasma process. Here, the plasma gas mixture is led via a pipe profile to the cathode, where it is connected to the additively manufactured minus pole. (FIG.: 14)

The negative pole is constructively designed in such a way that an inlet drilling to two cooling conductors runs inside the cathode. In this way, the cathode is actively cooled by the plasma gas and the current load is significantly reduced.

A coating lance for a plasma process was disclosed, the lance comprising a plasma shaft, a plasma neck and a plasma head, the plasma shaft comprising a longitudinal channel, which extends in an axial direction along an axis from a first shaft end to a second shaft end the plasma neck comprising a shaft attachment and a head attachment and at least one neck channel, which extends from the shaft attachment to the head attachment and the shaft attachment is arranged at the second shaft end in such a way that the longitudinal channel opens into the at least one neck channel the plasma head comprising a neck attachment, a plasma opening and at least one head channel, which extends from the neck attachment to the plasma opening and the neck attachment of the plasma head is arranged at the head attachment of the plasma neck in such a way that the at least one neck channel opens into the head channel. The course of the plasma channel deviates from the axis in such a way that the neck channel does not open into the head channel centered with respect to the axis, i.e. offset with respect to the axis.

The plasma neck is preferably detachably fixed at the second shaft end. Particularly preferably, the plasma head is also detachably fixed at the plasma neck.

The neck channel preferably has at least one curvature and preferably has at least two curvatures with opposite signs.

The plane defined by the edge of the plasma opening can advantageously be inclined with respect to the axis by an angle $\alpha<0°$.

A process for manufacturing a coating lance was disclosed as described above, wherein at least the plasma neck, preferably also the plasma head, is manufactured by means of an additive manufacturing process, preferably by a structure in layers.

The longitudinal channel in the plasma shaft can be manufactured at least partially, preferably completely, by means of deep-hole drilling.

The invention claimed is:

1. A rotatable coating lance system for a plasma process, the lance system comprising:
   a stationary connection;
   a plasma shaft;
   a plasma neck; and
   a plasma head;
   the plasma shaft, which is rotatably coupled to the stationary connection for rotation relative to the stationary connection, comprises a first shaft end, a second shaft end and a longitudinal channel, which extends in an axial direction along a rotational axis of the rotating plasma shaft from the first shaft end to the second shaft end, the plasma neck comprising a shaft attachment and a head attachment and at least one neck channel, which extends from the shaft attachment to the head attachment and the shaft attachment is arranged at the second shaft end in such a way that the longitudinal channel opens into the at least one neck channel, the plasma head comprising a neck attachment, a plasma opening and at least one head channel, which extends from the neck attachment to the plasma opening and the neck attachment of the plasma head is arranged at the head attachment of the plasma neck in such a way that the at least one neck channel opens into the head channel, wherein the plasma shaft, the plasma neck and plasma head form a plasma channel having a course that deviates from the rotational axis in at least a part of the neck channel.

2. The rotatable coating lance system according to claim 1, wherein the plasma neck is detachably fixed at the second shaft end.

3. The rotatable coating lance system according to claim 1, wherein the neck channel has at least one curvature and preferably has at least two curvatures with opposite signs.

4. The rotatable coating lance system according to claim 1, wherein the plane defined by the edge of the plasma opening is inclined with respect to the axis by an angle $\alpha < 0°$.

5. The rotatable coating lance system according to claim 1, wherein the plasma shaft is endlessly rotatable relative to the stationary connection.

6. The rotatable coating lance system according to claim 1, wherein the plasma neck is detachably fixed to the second shaft end of the plasma shaft.

7. The rotatable coating lance system according to claim 1, wherein the plasma head is detachably fixed to the plasma neck.

8. The rotatable coating lance system according to claim 1, wherein the plasma neck has at least two curvatures with opposite signs.

9. The rotatable coating lance system according to claim 1, wherein a center axis of a connection between the head attachment and the neck attachment is not centered with respect to the rotational axis.

10. A process for manufacturing the rotatable coating lance system according to claim 1, wherein at least the plasma neck is manufactured by an additive manufacturing process.

11. The process according to claim 10, wherein the longitudinal channel in the plasma shaft is manufactured at least partially by deep-hole drilling.

12. The process according to claim 10, wherein the plasma neck is manufactured as a structure in layers.

13. The process according to claim 10, wherein the plasma head is manufactured by the additive manufacturing process.

14. The process according to claim 13, wherein the plasma neck and the plasma head are manufactured as structures in layers.

15. The rotatable coating lance system according to claim 1, wherein the opening between the neck channel and the head channel is offset from the axis.

* * * * *